United States Patent [19]

Haond et al.

[11] Patent Number: 5,023,197

[45] Date of Patent: Jun. 11, 1991

[54] MANUFACTURING PROCESS OF MESA SOI MOS TRANSISTOR

[75] Inventors: Michel Haond, Meylan; Jean Galvier, Gieres, both of France

[73] Assignee: French State represented by the Minister of Post, Telecommunications and Space, France

[21] Appl. No.: 567,861

[22] Filed: Aug. 15, 1990

[30] Foreign Application Priority Data

Aug. 16, 1989 [FR] France ................. 89 11228

[51] Int. Cl.⁵ .......................... H01L 21/265
[52] U.S. Cl. .......................... 437/40; 437/41; 437/62; 437/63; 437/64; 437/83; 437/200; 437/228; 437/233; 148/DIG. 51; 148/DIG. 161
[58] Field of Search ........... 437/40, 228, 233, 200, 437/41, 186, 189, 490, 191, 180, 31, 83, 62, 64, 63; 148/DIG. 161, DIG. 51, 180

[56] References Cited

U.S. PATENT DOCUMENTS

| | | | |
|---|---|---|---|
| 4,349,408 | 9/1982 | Tarng et al. | 437/200 |
| 4,394,182 | 7/1983 | Maddox, III | 437/200 |
| 4,637,836 | 1/1987 | Flatley et al. | 437/40 |
| 4,716,128 | 12/1987 | Schubert et al. | 437/200 |
| 4,735,679 | 4/1988 | Lasky | 437/62 |
| 4,753,896 | 6/1988 | Matloubian | 437/83 |
| 4,903,108 | 2/1990 | Young et al. | 437/62 |
| 4,906,587 | 3/1990 | Blake | 437/41 |
| 4,916,086 | 4/1990 | Takahashi et al. | 437/62 |

FOREIGN PATENT DOCUMENTS 60-234326  11/1985  Japan ............... 148/DIG. 161

*Primary Examiner*—Brian E. Hearn
*Assistant Examiner*—Kevin Picardat
*Attorney, Agent, or Firm*—Lowe, Price, LeBlanc and Becker

[57] ABSTRACT

A method for manufacturing a MOS transistor formed in a silicon block on insulator with convex rounded up edges, initially consisting in etching the block in a thin layer of silicon on insulator (SOI). In this method etching of the block comprises the following steps: forming at the position where it is desired to obtain the block a mask layer portion (3) having a thickness slightly higher than that of the SOI; depositing a second silicon layer (11) having a predetermined thickness; and anisotropically etching silicon until said insulator is apparent outside the mask layer portion.

8 Claims, 1 Drawing Sheet

MANUFACTURING PROCESS OF MESA SOI MOS TRANSISTOR

BACKGROUND OF THE INVENTION

The present invention relates to MOS transistors manufactured from a thin silicon on insulator (SOI) layer and more particularly to mesa-type transistors, that is, transistors formed from individual blocks etched in the thin silicon layer.

FIG. 1A shows such a silicon block. block 1 is formed on an isolating substrate 2 and above the silicon block 1 is shown the mask portion 3 which has served to delineate it. Conventionally, insulator 2 is constituted by a silicon oxide layer formed on a silicon wafer and mask layer 3 is constituted by a silicon oxide and silicon nitride or an oxide-nitride-oxide (ONO) sandwich. In FIG. 1A, it is assumed that the silicon block 1 was delineated by anisotropic etching (for example in presence of a fluorine plasma) whereby each block exhibits rectilinear edges and has a parallelepiped shape.

FIG. 1B shows an analogous structure to that of FIG. 1A but wherein etching was made by wet etching with an acid such as potassium hydroxide (KOH).

The approach of FIG. 1A is generally preferred because in that case the size of the silicon block 1 corresponds with a great accuracy to the size of mask 3 whereas, in case of isotropic etching, the block size is not precisely determined. In addition, the use of KOH presents drawbacks associated with the possible presence of potassium residues. However, in case of anisotropic etching, the angle between the upper surface of a block is substantially perpendicular to the edges.

FIG. 2A is a lop view of a MOS transistor obtained from a vertical-edges block at an intermediate manufacturing step, and FIGS. 2B and 2C are section views according to planes BB and CC, respectively, of FIG. 2A. Those figures show a manufacturing step wherein the mask layer 3 has been eliminated, a thin gale oxide layer 5 has been deposited and a polysilicon gate layer 6 has been deposited and then etched according to the desired gate shape. After this step, conventionally, drain and source are implanted, spacers are formed on both sides of the gate, drain and source are implanted again and contacts are formed.

Such a circuit presents several drawbacks.

First, as can be seen in FIG. 2B, considering the gate oxide layer 5, the latter will unavoidably exhibit failures near right angle corners 7, whereby points with a low breakdown voltage occur at the upper mesa angles.

A second drawback is associated to the fact that, when the polysilicon gate 6 is etched, this step is anisotropically carried out for maintaining the size of the mask which has served to determine the gate. As a result, there remains conductive residues 8 visible in FIGS. 2A and 2C at the block periphery. Those residues are liable to cause shortings; to eliminate them, the gate has to be overetched and the mask size is no longer maintained, which constitutes a redhibitory drawback in case sizes smaller than one micrometer are to be achieved.

Thirdly, when a MOS transistor is formed, it is generally desired to overdop (according to a conductivity type inverse to that of the drain-source doping) the block periphery to cancel any parasitic transistor effect along transistor edges Such an overdoping implantation cannot be formed from an abrupt edge block as shown in FIG. 1A. It is then necessary to implement more sophisticated techniques, consisting, after forming mask pads 3 and before etching blocks 1, in implanting the silicon layer and annealing same to obtain a lateral penetration into block edges. After etching, blocks with overdoped edges are obtained. This method presents the drawback of requiring several additional manufacturing steps and to be relatively inaccurate.

All the above mentioned drawbacks of the transistors according to the prior art are due to the use of blocks with right angle edges.

SUMMARY OF THE INVENTION

Thus, the invention provides for manufacturing MOS transistors formed into silicon blocks etched in a thin silicon on insulator layer wherein each block exhibits convex rounded up edges.

The invention provides for a manufacturing method for such a MOS transistor initially consisting in etching a silicon block in a thin single crystal silicon on insulator layer, the etching of the block comprising the following steps:

forming at the position where it is desired to obtain the block a mask layer portion having a thickness slightly higher than that of the thin silicon layer on insulator;

depositing a second silicon layer of a predetermined thickness; and anisotropically etching silicon until said insulator is apparent outside the mask layer portion.

According to an embodiment of the invention, the mask is constituted by a silicon oxide/silicon nitride/silicon oxide sandwich. Then, it is possible to carry out the step consisting in implanting a dopant in the silicon block while it is still masked, in order to overdop its edges.

According to another embodiment of the invention, the mask is constituted by a silicon oxide/silicon/silicon oxide sandwich. The anisotropic etching step can then be subdivided into the following steps: etching the silicon until the upper layer of the mask is apparent; etching the upper silicon oxide of the mask; and etching the silicon until said insulator is apparent outside the mask layer portion.

The following description will show in detail how the structure according to the invention permits to avoid all the above drawbacks of the prior art.

BRIEF DISCLOSURE OF THE DRAWINGS

The foregoing and other objects, features and advantages of the invention will be apparent from the following detailed description of preferred embodiments as illustrated in the accompanying drawings wherein:

FIGS. 1A-2C designed to illustrate the state of the art and the problem encountered have been described above;

FIGS. 3A-3C show successive manufacturing steps of a MOS transistor block according to the invention.

As conventional in the field of integrated circuit representation it will be noted that the lateral sizes and the thicknesses of the various layers are not drawn to scale neither inside one figure nor from one figure to another. Those sizes are arbitrarily enlarged so as to improve the legibility of the drawings.

DESCRIPTION OF A PREFERRED EMBODIMENT

Figure 1A:
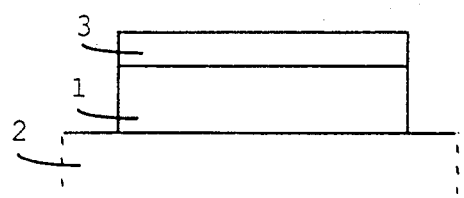
Figure 1B:
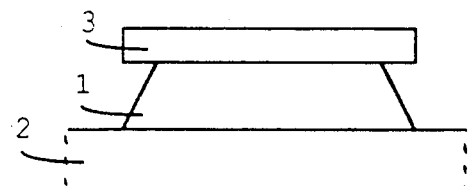
Figure 2A:
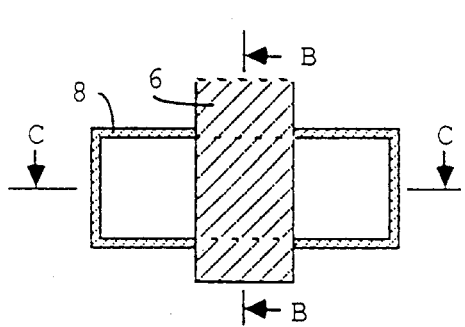
Figure 2B:
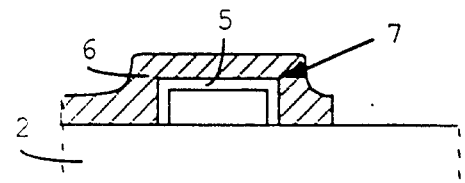
Figure 2C:
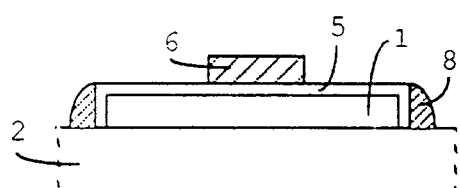
Figure 3A:
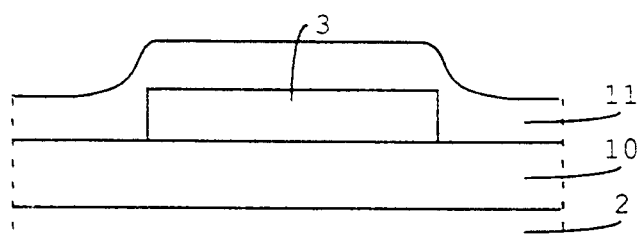

FIG. 3A shows a section view of a wafer comprising an isolating substrate 2, for example a silicon wafer, the upper surface of which is oxidized, on which has been formed a thin single crystal silicon layer 10. Above this layer, appears a portion of the mask layer 3 at a position where it is desired to form a single crystal silicon block.

According to the invention, the overall structure is coated with a silicon layer 11, which conventionally will be made of polysilicon or amorphous silicon formed through chemical vapor deposition (CVD). Mask layer 3 will be for example constituted by a sandwich comprising a thin silicon oxide layer, a silicon nitride layer and a thicker silicon oxide layer (OMO).

Figure 3B:
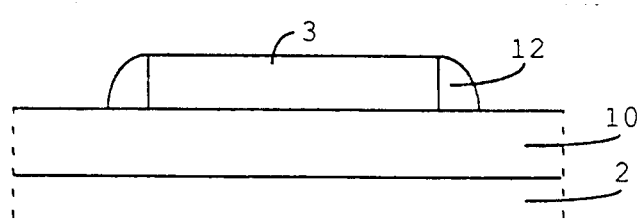
Figure 3C:
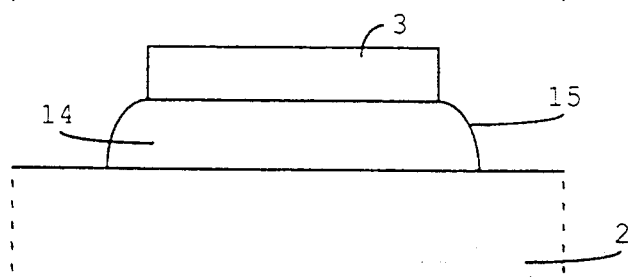

Then, silicon is anisotropically etched, for example in presence of a $SF_6$ plasma or chlorine plasma, such as used for forming polysilicon spacers in CMOS LDD technologies using drains extending under the gate. FIG. 3B shows an intermediate etching step, wherein the polysilicon layer has been completely eliminated in its plane portions but remains on the edges of the mask layer portion 3, where it was thicker Thus, when etching is continued until the isolating substrate 2 is reached, as shown in FIG. 3C, a silicon block 14, exhibiting convex rounded up edges 15 overlapping the mask layer 3, is obtained. In order for the spacer pattern to be reproduced on the block edges without formation of a step, the thickness of the silicon layer 11 has to be equal to or slightly higher than that of the thin silicon layer 10. The thickness of the silicon layer 11 will determine the lateral size of the spacers.

Then, it is possible to eliminate all the above drawbacks of the prior art, more particularly:

it is easy to implant a dopant which will reach only the portions protruding from block 14 and will then form an overdoing at a determined position of the block edges;

owing to rounded up profile of blocks 14, the thin gate oxide layer 5 that will be deposited later on will not exhibit cracks;

still owing to the rounded up profile of block edges, when a gate polysilicon is deposited, the latter will not exhibit an excessive thickness and will be deposited substantially conforming to the profile of isolating substrate 2 and block 14 and will then be able to be anisotropically etched without residues.

In a first exemplary embodiment of the invention, in case of a thin silicon layer on insulator 10 having a thickness of 150 nm, a mask 3 comprising successive layers of $SiO_2$, $Si_3N_4$ and $SiO_2$ having thicknesses of 15 nm, 125 nm and 30 nm, respectively, can be used. The polysilicon layer 11 may have a thickness of 300 nm. In that case, once block 14 is formed, as shown in FIG. 3C, mask 3 still remains in place This is an advantage for the lateral implantation of the block but presents a drawback because this mask has to be eliminated later on, which may damage the structure.

In a second exemplary embodiment of the invention, in mask 3, the nitride layer is replaced by a polysilicon layer. In that case, etching of silicon 11 will be stopped at the step illustrated in FIG. 3B, the upper oxide layer of the mask will be eliminated, and etching of the silicon layer 10 and spacers 12 will be continued while, simultaneously, the mask silicon layer will be eliminated to leave in place only the lower silicon oxide layer of the mask. This offers the advantage that the remaining portion of the mask (oxide layer) is then very easy to eliminate, but it is then necessary to initially form a lateral doping implantation, immediately after formation of mask 3.

The above exemplary applications are given to illustrate the numerous possibilities and variants of the invention; those skilled in the art will be able to select various materials and sizes in accordance with their experience.

We claim:

1. A method for manufacturing a MOS transistor in a silicon on insulator block wherein said block exhibits convex rounded up edges, initially consisting in etching the block in a thin layer of single crystal silicon on insulator, wherein etching of the block comprises the following steps:
    forming at the position where it is desired to obtain the block a mask layer portion (3) having a thickness slightly larger than that of the thin silicon on insulator layer;
    depositing a second silicon layer (11) having a predetermined thickness; and
    anisotropically etching silicon until said insulator is apparent outside said mask portion.

2. A method according to claim 1, wherein the insulator on which is formed said thin silicon layer is constituted by a silicon oxide layer formed on a silicon wafer.

3. A method according to claim 1, wherein said mask is constituted by a silicon oxide/silicon nitride/silicon oxide sandwich.

4. A method according to claim 1, wherein said mask is constituted by a silicon oxide/silicon sandwich.

5. A method according to claim 3, further comprising the step consisting in implanting a dopant in the silicon block while it is still masked, in order to overdop its edges.

6. A method according to claim 1, wherein the mask is constituted by a silicon oxide/silicon/silicon oxide sandwich.

7. A method according to claim 6, further comprising the step consisting in implanting a dopant after formation of said mask layer portion (3).

8. A method according to claim 5, wherein the anisotropic etching step according to claim 1 is subdivided into the following steps:
    etching the silicon until the upper layer of the mask is apparent;
    etching the upper silicon layer of the mask; and
    etching the silicon until said insulator is apparent outside the mask layer portion.

* * * * *